United States Patent
Yamada et al.

(10) Patent No.: US 10,448,546 B1
(45) Date of Patent: Oct. 15, 2019

(54) NOISE SUPPRESSION SHEET

(71) Applicant: TDK CORPORATION, Tokyo (JP)

(72) Inventors: Takashi Yamada, Tokyo (JP); Miyuki Yanagida, Tokyo (JP); Atsushi Sato, Tokyo (JP); Kenichi Kawabata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/143,881

(22) Filed: Sep. 27, 2018

(51) Int. Cl.
*H05K 9/00* (2006.01)
*H01F 1/147* (2006.01)

(52) U.S. Cl.
CPC ....... *H05K 9/0084* (2013.01); *H01F 1/14708* (2013.01); *H05K 9/0088* (2013.01)

(58) Field of Classification Search
CPC .................................................. H05K 9/0088
See application file for complete search history.

(56) References Cited

U.S. PATENT DOCUMENTS

| 2015/0334885 A1* | 11/2015 | Tomonari | H05K 9/0083 |
| | | | 428/136 |
| 2016/0007510 A1* | 1/2016 | Cheng | H05K 9/0088 |
| | | | 428/551 |

FOREIGN PATENT DOCUMENTS

JP          2009-170634 A          7/2009

* cited by examiner

*Primary Examiner* — Hung V Ngo
(74) *Attorney, Agent, or Firm* — Oliff PLC (57) ABSTRACT

Disclosed is a noise suppression sheet 1 including a resin layer 2, a non-magnetic metal layer 3, and a metal magnetic layer 4 in this order.

4 Claims, 5 Drawing Sheets

NOISE SUPPRESSION SHEET

TECHNICAL FIELD

The present invention relates to a noise suppression sheet.

BACKGROUND

In recent years, along with increasing operation speed of a digital circuit in an electronic apparatus, erroneous operation of the electronic apparatus or an adverse effect on a human body caused by noise such as electromagnetic waves generated from the circuit has been deepening. For this reason, development of a noise suppression sheet for suppressing (blocking) noise has been progressed. For example, Patent Literature 1 discloses a noise suppression sheet obtained by laminating two or more metal magnetic layers having a single layer thickness of 10 to 80 μm with an adhesive layer by using a laminating method.

CITATION LIST

Patent Literature

[Patent Literature 1] Japanese Unexamined Patent Publication No. 2009-170634

SUMMARY

Technical Problem

In recent years, lighter weight, thinner size, and higher integration of an electronic apparatus mounting a digital circuit have progressed, and along with this, thinner film of a noise suppression sheet has also been required. Although a sheet having high magnetic permeability is required for sufficiently satisfying the performance of a noise suppression sheet, when the thickness of a conventional noise suppression sheet is reduced, high magnetic permeability cannot be maintained and thus the performance of the noise suppression sheet cannot be maintained sufficiently.

An object of the present invention is to provide a noise suppression sheet capable of maintaining high magnetic permeability even in the case of reducing the thickness.

Solution to Problem

The present invention provides a noise suppression sheet comprising a resin layer, a non-magnetic metal layer, and a metal magnetic layer in this order.

The resin layer may comprise an electroless plating catalyst and a resin, and in this case, the non-magnetic metal layer may be a non-magnetic metal plating layer. In this case, the resin layer may include a mixed region formed from a surface of the resin layer on the non-magnetic metal layer side toward an inside of the resin layer, and contain a metal constituting the non-magnetic metal layer and electroless plating catalysts incorporated inside the resin layer are included.

In the noise suppression sheet, a thickness of the metal magnetic layer may be 1 to 10 μm.

The noise suppression sheet may further comprise an adhesive layer provided on a main surface of the resin layer opposite to the side of the non-magnetic metal layer.

The noise suppression sheet may further comprise a rustproof layer or an insulating layer provided on a main surface of the metal magnetic layer opposite to the side of the non-magnetic metal layer.

Advantageous Effects of Invention

The present invention can provide a noise suppression sheet capable of maintaining high magnetic permeability even in the case of reducing the thickness.

DETAILED DESCRIPTION

Figure 1:
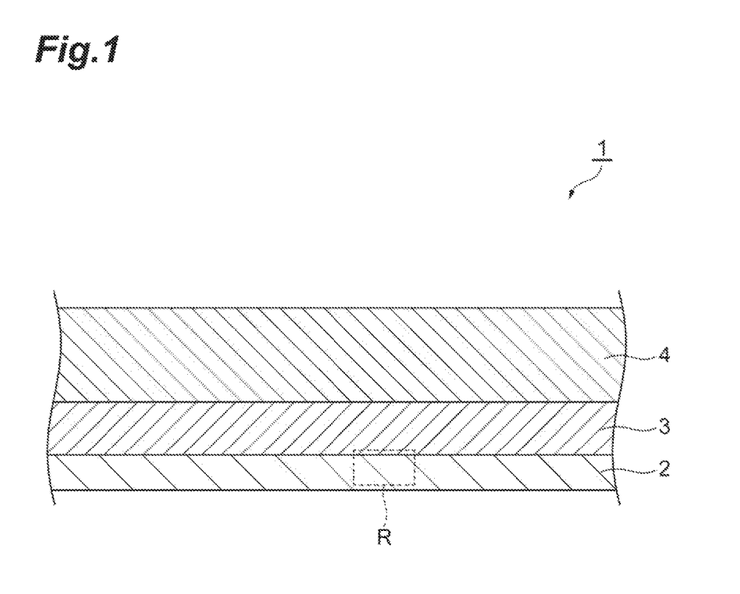
FIG. 1 is a schematic sectional view showing one embodiment of a noise suppression sheet.

Hereinafter, preferable embodiments of the present invention will be described in detail, with reference as necessary to the drawings. However, the present invention is not limited to the following embodiments FIG. 1 is a schematic sectional view showing one embodiment of a noise suppression sheet. A noise suppression sheet 1 shown in FIG. 1 comprises a resin layer 2, a non-magnetic metal layer 3, and a metal magnetic layer 4 in this order.

The present inventors consider the reason why the magnetic permeability can be maintained even when the thickness is reduced by using the above structure of the noise suppression sheet as follows. While noise such as electromagnetic waves generated from circuits is absorbed by the metal magnetic layer 4 of the noise suppression sheet 1 in some degree, there is a certain amount of the noise that is not absorbed and transmitted. It is considered that the noise suppression sheet according to the present embodiment can suppress the generated noise more efficiently because the non-magnetic metal layer 3 is further provided on the metal magnetic layer 4, and the above transmitted noise is reflected on the non-magnetic metal layer 3 and can be absorbed in the metal magnetic layer 4 again.

Examples of the resin forming the resin layer 2 may include a thermosetting resin and an ultraviolet curing resin. Examples of the thermosetting resin include a polyester resin, an epoxy resin, a phenol resin, and a melamine resin. Examples of the ultraviolet curing resin include an acrylate resin and an epoxy resin.

The thickness of the resin layer 2 may be 0.1 μm or more, 0.5 μm or more, or 1.0 μm or more from the view point of maintaining the strength of the noise suppression sheet and may be 10.0 μm or less, 5.0 μm or less, or 1.0 μm or less from the view point of thinner size of the noise suppression sheet.

The resin layer 2 is preferable to further contain an electroless plating catalyst from the view point of maintaining the adhesion with the non-magnetic metal layer 3 as described below.

The electroless plating catalyst included in the resin layer 2 may be a metal selected from Pd, Cu, Ni, Co, Au, Ag, Rh, Pt, In and Sn, and is preferably Pd. The electroless plating catalysts may be used singly or in combination of two or more. Typically, the electroless plating catalyst is dispersed in a resin as electroless plating catalyst particles.

The content of the electroless plating catalyst in the resin layer 2 may be 3% by mass or more, 4% by mass or more, or 5% by mass or more, and may be 50% by mass or less, 40% by mass or less, or 25% by mass or less, based on the total amount of the resin layer.

While the electroless plating catalyst is preferably included in the resin layer 2 as described above, it may be present on the surface of the side of the resin layer 2 in contact with the non-magnetic metal layer 3.

The non-magnetic metal layer 3 is a layer including a non-magnetic metal. The non-magnetic metal layer 3 can be formed on the above resin layer 2 by the electroless plating method for example, as described below. That is, the non-magnetic metal layer 3 may be a non-magnetic metal plating layer. The non-magnetic metal layer 3 may be a layer consisting of a single non-magnetic metal plating or may be constituted of a plurality of non-magnetic metal platings having different metal species.

Examples of the non-magnetic metals forming the non-magnetic metal layer 3 include Cu, Al, Sn, and Bi, preferably at least one selected from the group consisting of Cu and Al.

The thickness of the non-magnetic metal layer 3 may be 1 µm or more or 2 µm or more from the view point of effectively reflecting noise, and may be 4 µm or less, 3 µm or less, or 2 µm or less from the view point of thinner size of the noise suppression sheet.

Figure 2:
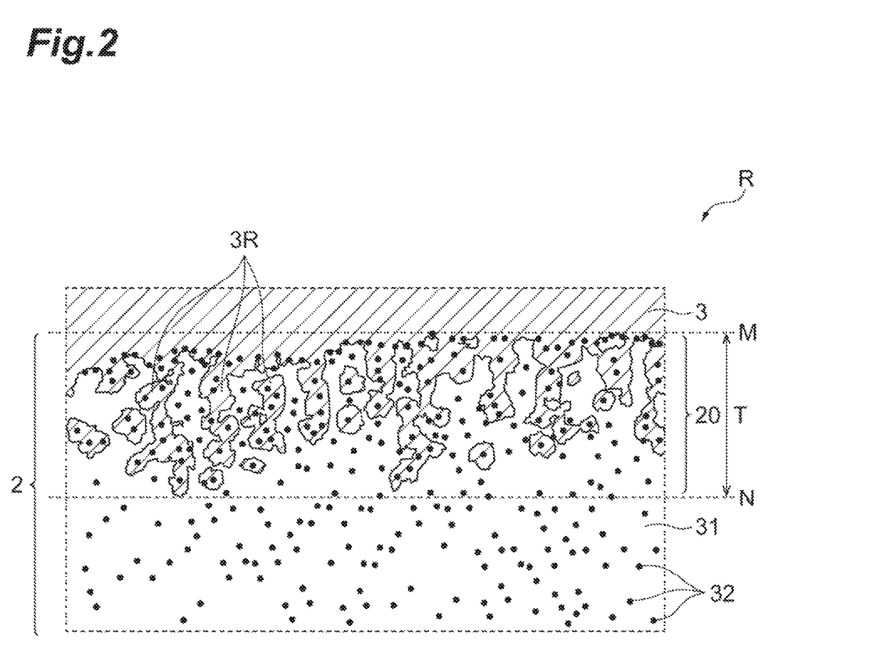
FIG. 2 is a partially enlarged view of the noise suppression sheet shown in FIG. 1.

FIG. 2 is an enlarged view of the region R in the noise suppression sheet 1 shown in FIG. 1. As shown in FIG. 2, the resin layer 2 may have the mixed region 20 formed from the surface (or the upper boundary M) of the resin layer 2 toward the side of the non-magnetic metal layer 3 to the inside of the resin layer 2, and including a non-magnetic metal constituting the non-magnetic metal layer 3 and including a plurality of the metal particle 3R incorporated inside the resin layer 2. That is, the mixed region 20 includes the metal particle 3R, a resin 31 that is a main component of the resin layer 2, and the electroless plating catalyst (electroless plating catalyst particle) 32. The metal particle 3R typically includes grown metal plating starting from the electroless plating catalyst particle 32. Therefore, the electroless plating catalyst particle 32 is often incorporated in the metal particle 3R. It is preferable that at least some of a plurality of the metal particles 3R are continuously connected from the non-magnetic metal layer 3 to the mixed region. It can be confirmed by observation using the scanning electron microscope, for example, that the mixed region 20 has been formed.

Thus, the resin layer 2 contains the resin 31 and the electroless plating catalyst 32, allowing for the formation of the mixed region 20 and higher adhesion with the non-magnetic metal layer 3.

From the view point of higher adhesion with the non-magnetic metal layer 3, the thickness T of the mixed region 20 is preferably 1 nm or more, more preferably 5 nm or more, and furthermore preferably 10 nm or more, and preferably 200 nm or less, more preferably 100 nm or less, and furthermore preferably 50 nm or less.

The thickness T of the mixed region 20 is defined as the distance from the upper boundary M on the side of the non-magnetic metal layer 3 to the lower boundary N toward the opposite side of the non-magnetic metal layer 3 in the resin layer 2. Each of the upper boundary M and the lower boundary N is a cross section of the direction perpendicular to the thickness direction of the resin layer 2 (hereinafter, refer to as "horizontal surface"). The upper boundary M is a horizontal surface located most nearly in the side of the non-magnetic metal layer 3 of all the horizontal surfaces including the resin 31 that constitutes the resin layer 2. The lower boundary N is a horizontal surface located most far on the opposite side of the non-magnetic metal layer 3 of all the horizontal surfaces including the metal particle 3R. The lower boundary N is a horizontal surface located most far on the opposite side of the non-magnetic metal layer 3 of all the horizontal surfaces including the metal particle 3R. The upper boundary M and the lower boundary N can be determined by observation of a cross section along the thickness direction of the noise suppression sheet 1 (hereinafter, refer to as "vertical surface") by using the scanning electron microscope. A plurality of the vertical surfaces are observed to determine the thickness T of the mixed region, and this average values may be regarded as the thickness T of the mixed region 20 in the noise suppression sheet 1. Due to the mixed region formed, the peeling of the non-magnetic metal layer 3 off from the resin layer 2 is effectively suppressed.

The ratio of the thickness T of the mixed region 20 to the thickness of the resin layer 2 is preferably 0.01 or more, more preferably 0.02 or more, and furthermore preferably 0.03 or more, and preferably 0.1 or less, more preferably 0.08 or less, and furthermore preferably 0.05 or less.

The method for forming the non-magnetic metal layer 3 on the resin layer 2 is not limited particularly, and examples of the method include the electroless plating method. Examples of the electroless plating method include the method of performing water washing after soaking the resin layer 2 in an electroless plating bath including metal ions constituting predetermined non-magnetic metals. The electroless plating bath may further include phosphorus, boron, and iron. Treatment conditions of the electroless plating bath including metal ions is not limited particularly, but treatment temperature is 70 to 90° C. and treatment time is 10 to 120 seconds, for example, in the case of using the electroless plating bath containing 0.1 to 2.0% by mass of a predetermined metal ion. When the electroless plating catalyst is included in the resin layer 2, an electroless metal plating as the non-magnetic metal layer 3 can be formed from the electroless plating catalyst as the starting-point.

The metal magnetic layer 4 is a layer including a metal magnetic. The metal magnetic layer 4 can be formed on the above non-magnetic metal layer 3 by the electro-plating method or the electroless plating method. That is, the metal magnetic layer 4 can be regarded as a magnetic metal plating layer. The metal magnetic layer 4 may be a single layer consisting of a magnetic metal plating or may be constituted of a plurality of magnetic metal platings having different metal species.

As metal magnetics forming the metal magnetic layer 4, any metals having magnetism can be used. Particularly, from the view point of effectively absorbing and suppressing noise, the metal magnetic layer is preferable to be a layer including permalloy, and is furthermore preferable to be a layer consisting of permalloy. Permalloy is an alloy including Fe and Ni, and its composition is not limited particularly, but from the view point of achieving higher magnetic permeability, it is preferable to use permalloy in which the content ratio of Fe and Ni (Fe/Ni) is 10 to 50, 15 to 40, or 18 to 25 in the mass ratio.

The thickness of the metal magnetic layer 4 may be 0.1 µm or more, 0.5 µm or more, 1 µm or more, or 5 µm or more from the view point of effectively absorbing noise, and may be 20 µm or less, 15 µm or less, 10 µm or less, or 7 µm or less from the view point of thinner size of the noise suppression sheet.

A method for forming the metal magnetic layer 4 on the non-magnetic metal layer 3 is not limited particularly, and examples of the method include the electro-plating method or the electroless plating method. Examples of the electro-plating method include the method involving performing water washing after soaking a laminate comprising the resin layer 2 and the non-magnetic metal layer 3 in an electro-plating bath including metal ions constituting a predetermined metal magnetic in a predetermined ratio. The electro-plating bath may further include phosphorus and boron. Treatment conditions of the electro-plating bath including metal ions are not limited particularly but soaking for 3 to 90 minutes may be performed using the electro-plating bath in which the pH ranges from 2 to 3 and the bath temperature ranges from 35 to 50° C. under the condition of a current density of 0.5 to 5 A/dm$^2$, for example. In the plating bath, a content of a compound providing metal ions may be 1 to 400 g/L, for example, and a content of phosphorus and boron may be 5 to 50 g/L for example.

Figure 3:
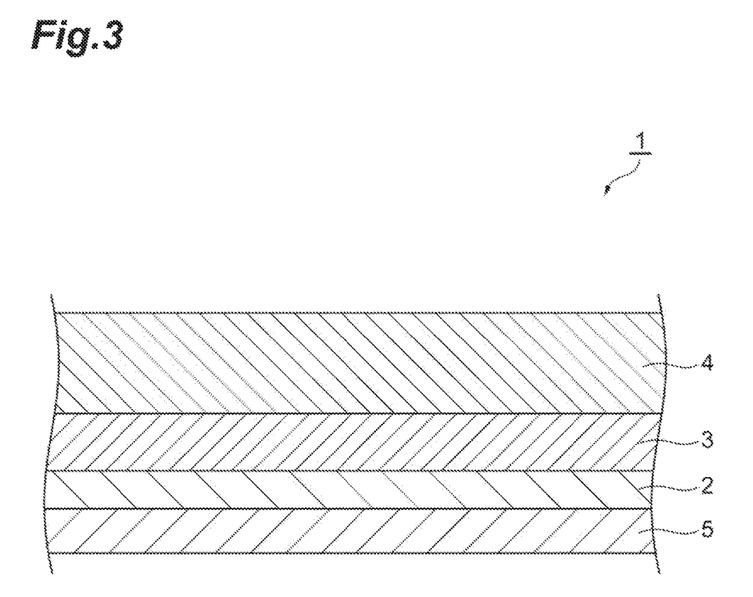
FIG. 3 is a schematic sectional view showing another embodiment of the noise suppression sheet.

FIG. 3 is a schematic sectional view showing another embodiment of the noise suppression sheet. As shown in FIG. 3, the noise suppression sheet 1 may comprise the adhesive layer 5 which is provided on the main surface of the resin layer 2 opposite to the side of the non-magnetic metal layer 3, other than the resin layer 2, the non-magnetic metal layer 3, and the metal magnetic layer 4 as described above. The noise suppression sheet 1 can be adhesive to a desired position in electronic devices by providing the adhesive layer 5, and noise generated from electronic devices can be suppressed more effectively.

The adhesive layer 5 is not limited particularly, but examples of the adhesive layer include a double-sided tape. Examples of the double-sided tape include an acrylic adhesive, a rubber adhesive, and a silicone adhesive.

The thickness of the adhesive layer 5 may be 1 µm or more, 5 µm or more, or 10 µm or more, and may be 1000 µm or less, 100 µm or less, or 10 µm or less.

Figure 4:
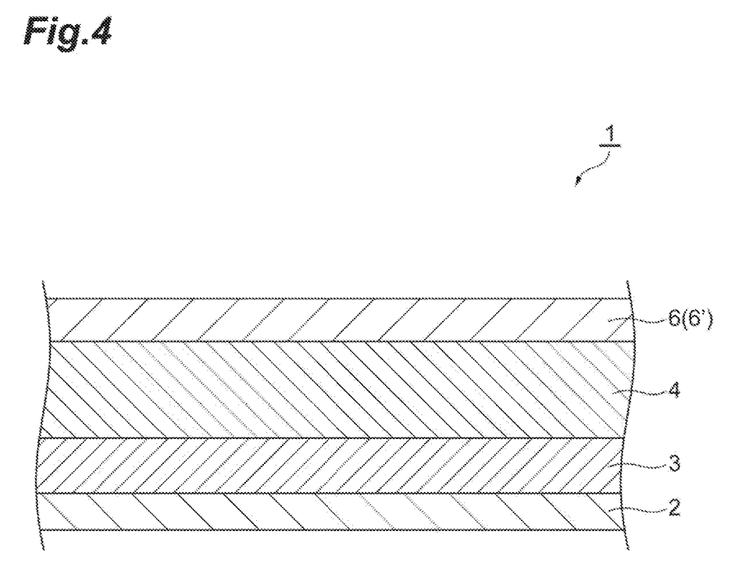
FIG. 4 is a schematic sectional view showing another embodiment of the noise suppression sheet.

FIG. 4 is a schematic sectional view showing another embodiment of the noise suppression sheet. As shown in FIG. 4, the noise suppression sheet 1 may further comprise a rustproof layer 6 or an insulating layer 6' which is provided on the main surface of the metal magnetic layer 4 opposite to the side of the non-magnetic metal layer 3, other than the resin layer 2, the non-magnetic metal layer 3, and the metal magnetic layer 4 as described above. In addition, the noise suppression sheet may comprise both the rustproof layer 6 and the insulating layer 6'.

The rustproof layer 6 can be formed by rustproofing using phosphates and chromates on the main surface of the metal magnetic layer opposite to the side of the non-magnetic metal layer, for example.

The thickness of the rustproof layer 6 may be 0.5 µm or more, 1.0 µm or more, or 2.0 µm or more, and may be 3.0 µm or less or 2.0 µm or less.

The insulating layer 6' may be formed of a material having insulation, for example. That is, the insulating layer 6' may be a layer functioning as a rustproof layer. The material having insulating property may be an inorganic material or a resin. Examples of the inorganic material include a compound containing silicon such as $SiO_2$ and SiN. Examples of the resin include an epoxy resin and a polyimide resin.

The thickness of the insulating layer may be 0.5 µm or more, 1.0 µm or more, or 2.0 µm or more, and may be 3.0 µm or less or 2.0 µm or less.

The thickness of the noise suppression sheet according to the present embodiment may be 3 µm or more, 5 µm or more, or 10 µm or more from the view point of maintaining the strength of the noise suppression sheet, and may be 20 µm or less, 15 µm or less, or 10 µm or less from the view point of thinner size of the noise suppression sheet.

The noise suppression sheet according to the present embodiment is packaged in electronic devices, enabling noise (electromagnetic wave) generated from circuits in electronic devices to be absorbed and suppressed. The noise suppression sheet according to the present embodiment is preferably used as an electromagnetic wave shield.

EXAMPLES

Hereinafter, the present invention will be described in detail by Examples, but the present invention is not limited to these Examples.

Preparation of Noise Suppression Sheet

Example 1

A resin composition containing 20% by mass of palladium particles and an isocyanate resin was prepared.

The first laminate comprising a resin layer having 1 µm thickness on a PET film was obtained by applying the obtained resin composition on the PET film (trade name "Cosmo Shine A4100" manufactured by Toyobo Co., Ltd.) and drying. The second laminate in which a non-magnetic metal layer (Cu layer) having 2 µm thickness was formed was obtained by soaking the first laminate in an electroless plating bath including 3.0 g/L of cupper ion and performing electroless plating treatment for 45 minutes at a plating bath temperature of 38° C. The thickness of the mixed region in the second laminate was 38 nm.

A noise suppression sheet (thickness: 8 µm) in which a metal magnetic layer (a layer including permalloy) having 5 µm thickness was formed was prepared by soaking the obtained second laminate in an electro-plating bath at pH 2.5 having a composition of 200 g/L of nickel sulfate hexahydrate, 10 g/L of nickel chloride hexahydrate, 10 g/L of iron sulfate heptahydrate, 30 g/L of boric acid, 3 g/L of saccharin sodium, and 0.1 g/L of sodium lauryl sulfate and by performing electro-plating treatment for 30 minutes under the condition of a plating temperature of 40° C. and a current density of 1 A/dm$^2$. The content ratio of Fe and Ni (Fe/Ni) in permalloy was 21.5 in the mass ratio.

Example 2

A noise suppression sheet (thickness: 4 µm) was prepared by the same operation as in Example 1, except that the electro-plating treatment period was changed from 30 to 6 minutes and a metal magnetic layer (a layer including permalloy) having 1 µm thickness was formed. The content ratio of Fe and Ni (Fe/Ni) in permalloy was 19.5 in the mass ratio.

Example 3

A noise suppression sheet (thickness: 13 µm) was prepared by the same operation as in Example 1, except that the electro-plating treatment period was changed from 30 to 60 minutes and a metal magnetic layer (a layer including permalloy) having 10 µm thickness was formed. The content ratio of Fe and Ni (Fe/Ni) in permalloy was 20.4 in the mass ratio.

Example 4

A noise suppression sheet (thickness: 3.5 μm) was prepared by the same operation as in Example 1, except that the electro-plating treatment period was changed from 30 to 3 minutes and a metal magnetic layer (a layer including permalloy) having 0.5 μm thickness was formed. The content ratio of Fe and Ni (Fe/Ni) in permalloy was 21.2 in the mass ratio.

Example 5

A noise suppression sheet (thickness: 18 μm) was prepared by the same operation as in Example 1, except that the electro-plating treatment period was changed from 30 to 90 minutes and a metal magnetic layer (a layer including permalloy) having 15 μm thickness was formed. The content ratio of Fe and Ni (Fe/Ni) in permalloy was 22.1 in the mass ratio.

Example 6

The first laminate was obtained by performing the same operation as in Example 1. The second laminate in which a non-magnetic metal layer (Al layer) having 2 μm thickness was formed was obtained by soaking the obtained first laminate in an electroless plating bath including 2.5 g/L of aluminum ion and performing electroless plating treatment for 45 minutes at a plating bath temperature of 38° C. The thickness of the mixed region in the second laminate was 45 nm.

A noise suppression sheet (thickness: 8 μm) comprising a metal magnetic layer (a layer including permalloy) having 5 μm thickness was prepared by performing the same operation as in Example 1 on the obtained second laminate. The content ratio of Fe and Ni (Fe/Ni) in permalloy was 21.7 in the mass ratio.

Comparative Example 1

Permalloy in which the content ratio of Fe and Ni (Fe/Ni) was 18.5 in the mass ratio was processed into a sheet by rolling, and a metallic magnetic sheet (thickness: 5 μm) having 5 μm thickness was prepared.

Comparative Example 2

Permalloy in which the content ratio of Fe and Ni (Fe/Ni) was 19.1 in the mass ratio was processed by rolling into a sheet, and a sheet comprising a metal magnetic layer (a layer including permalloy) having 10 μm thickness was prepared. Permalloy in which the content ratio of Fe and Ni (Fe/Ni) was 18.7 in the mass ratio was further laminated by rolling on the obtained sheet, and a sheet (thickness: 20 μm) comprising the constitution in which two metal magnetic layers (layers including permalloy) having 10 μm thickness were laminated was prepared.

Evaluation of Noise Suppression Sheet
Measurement of Magnetic Permeability

The noise suppression sheets obtained in Examples 1 to 6 and the sheets obtained in Comparative Examples 1 and 2 were processed like a ring to measure the frequency characteristics of magnetic rate using an impedance analyzer. The frequency characteristics were checked and permeabilities at 1 MHz were read. The results are shown in Table 1.

Bending Test

The following bending test was performed for the noise suppression sheets obtained in Examples 1 to 6, and the presence of peeling between respective layers was checked.

Figure 5:
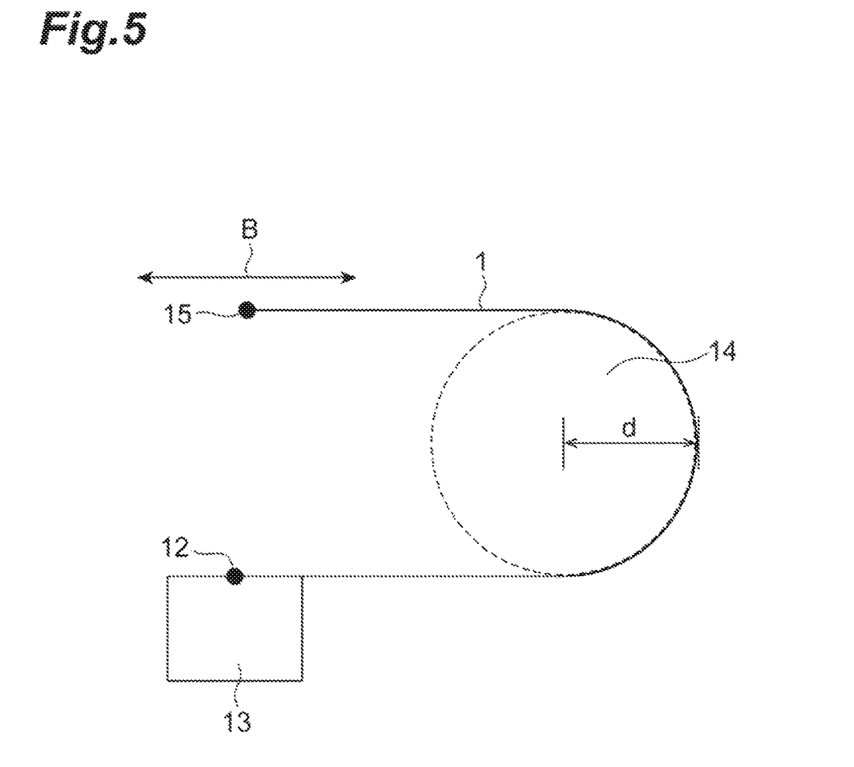
FIG. 5 is a schematic view of a bending resistance testing machine.

Samples of each of the noise suppression sheet having 150 mm length and 50 mm width were prepared. These samples were provided for the bending test according to JISC5016 using the bending resistance testing machine shown in FIG. 5. That is, the end part 12 of the noise suppression sheet 1 maintained to be fixed at the fixed part 13, and the noise suppression sheet 1 was arranged to be bent by placing the noise suppression sheet 1 alongside the peripheral surface (radius of curvature d: 5 mm) of the circle of the bending part 14. Subsequently, the end part 15 opposite to the side of the end part 12 was reciprocated along the direction shown by the arrow B. The reciprocating distance was 30 mm and the reciprocating frequency was 150 times per minute, and the end part 15 was reciprocated repeatedly for 1 minute. The cross section of the sample after the bending test was observed with the scanning electron microscope to check the presence of peeling between respective layers.

It was confirmed that the peeling between respective layers was absent in the samples after the above bending test for any of the noise suppression sheets obtained in Examples 1 to 6.

TABLE 1

| | Thickness of resin layer (μm) | Non-magnetic metal layer (thickness: μm) | Thickness of metal magnetic layer (μm) | Magnetic Permeability (1 MHz) |
|---|---|---|---|---|
| Example 1 | 1 | Cu (2) | 5 | 530 |
| Example 2 | 1 | Cu (2) | 1 | 215 |
| Example 3 | 1 | Cu (2) | 10 | 236 |
| Example 4 | 1 | Cu (2) | 0.5 | 163 |
| Example 5 | 1 | Cu (2) | 15 | 189 |
| Example 6 | 1 | Al (2) | 5 | 517 |
| Comparative Example 1 | — | — | 5 | —*2 |
| Comparative Example 2 | — | — | 20*1 | 150 |

*1Total thickness of 2 layers of 10 μm sheet is shown.
*2Could not be measured because sheet breakage occurred during measurement.

DESCRIPTION OF SYMBOLS

1: noise suppression sheet, 2: resin layer, 3: non-magnetic metal layer, 3R: metal particle, 4: metal magnetic layer, 5: adhesive layer, 6: rustproof layer, 6': insulating layer, 20: mixed region, 31: resin, and 32: electroless plating catalyst (electroless plating catalyst particle)

What is claimed is:
1. A noise suppression sheet comprising:
a resin layer;
a non-magnetic metal layer; and
a metal magnetic layer
in this order, wherein
the resin layer comprises an electroless plating catalyst and a resin, and the non-magnetic metal layer is a non-magnetic metal plating layer, and
the resin layer includes a mixed region formed from a surface of the resin layer on the non-magnetic metal layer side toward an inside of the resin layer, and contains a metal constituting the non-magnetic metal layer and the electroless plating catalyst incorporated inside the resin layer.

2. The noise suppression sheet according to claim 1, wherein a thickness of the metal magnetic layer is 1 to 10 μm.

3. The noise suppression sheet according to claim 1, further comprising an adhesive layer provided on a main surface of the resin layer opposite to the side of the non-magnetic metal layer.

4. The noise suppression sheet according to claim 1, further comprising a rustproof layer or an insulating layer provided on a main surface of the metal magnetic layer opposite to the side of the non-magnetic metal layer.

* * * * *